(12) United States Patent
Choi

(10) Patent No.: US 11,217,564 B2
(45) Date of Patent: Jan. 4, 2022

(54) STACK PACKAGES WITH INTERPOSER BRIDGE

(71) Applicant: SK hynix Inc., Icheon-si Gyeonggi-do (KR)

(72) Inventor: Bok Kyu Choi, Yongin-si Gyeonggi-do (KR)

(73) Assignee: SK hynix Inc., Icheon-si (KR)

( * ) Notice: Subject to any disclaimer, the term of this patent is extended or adjusted under 35 U.S.C. 154(b) by 93 days.

(21) Appl. No.: 16/883,364

(22) Filed: May 26, 2020

(65) Prior Publication Data

US 2021/0143128 A1    May 13, 2021

(30) Foreign Application Priority Data

Nov. 11, 2019  (KR) ........................ 10-2019-0143816

(51) Int. Cl.
  *H01L 25/065* (2006.01)
  *H01L 23/538* (2006.01)

(52) U.S. Cl.
  CPC ...... *H01L 25/0657* (2013.01); *H01L 23/5381* (2013.01); *H01L 23/5384* (2013.01); *H01L 2225/06513* (2013.01); *H01L 2225/06517* (2013.01); *H01L 2225/06548* (2013.01); *H01L 2225/06562* (2013.01); *H01L 2225/06572* (2013.01); *H01L 2225/06586* (2013.01)

(58) Field of Classification Search
  CPC . H01L 2225/06548; H01L 2224/02373; H01L 25/0657
  See application file for complete search history.

(56) References Cited

U.S. PATENT DOCUMENTS

2019/0057940 A1* 2/2019 Cheah ................. H01L 25/0652
2020/0020638 A1* 1/2020 Heo .................... H01L 25/0652

FOREIGN PATENT DOCUMENTS

KR    1020140095182 A    8/2014
KR    1020160052739 A    5/2016

* cited by examiner

*Primary Examiner* — Yu-Hsi D Sun
(74) *Attorney, Agent, or Firm* — William Park & Associates Ltd.

(57) ABSTRACT

A stack package includes a lower semiconductor chip disposed on a package substrate, an interposer bridge including through vias, and an upper semiconductor chip. The upper semiconductor chip has a first edge and a second edge which are opposite to each other. The upper semiconductor chip includes a first region, a third region and a connection region which are located between the first and second edges. The upper semiconductor chip also includes a redistributed layer pattern that connects pads disposed on the first and third regions to each other. The redistributed layer pattern extends onto the connection region.

20 Claims, 10 Drawing Sheets

STACK PACKAGES WITH INTERPOSER BRIDGE

CROSS-REFERENCE TO RELATED APPLICATIONS

The present application claims priority under 35 U.S.C. 119(a) to Korean Application No. 10-2019-0143816, filed on Nov. 11, 2019, which is incorporated herein by references in its entirety.

BACKGROUND

1. Technical Field

Embodiments of the present disclosure relate generally to package technologies and, more particularly, to stack packages with an interposer bridge.

2. Related Art

Recently, techniques for adopting a plurality of semiconductor chips into a single package have been developed to provide fast semiconductor packages with a large capacity of memory. For example, a plurality of semiconductor chips may be two-dimensionally disposed on the same plane to provide a single semiconductor package having a planar stack structure. The planar stack structure may lead to increase of a planar area and a size of the semiconductor package. Accordingly, a lot of effort has been focused on three-dimensionally stacking a plurality of semiconductor chips in a limited planar area to reduce a size of the semiconductor package. That is, advanced techniques for vertically stacking a plurality of semiconductor chips have been proposed to provide compact semiconductor packages.

SUMMARY

According to an embodiment, a stack package includes a lower semiconductor chip disposed on a package substrate, an interposer bridge disposed on the package substrate to be spaced apart from the lower semiconductor chip and configured to include through vias, and an upper semiconductor chip disposed on the lower semiconductor chip to extend onto the interposer bridge and electrically connected to the package substrate by the through vias. The upper semiconductor chip includes a first edge and a second edge which are opposite to each other, a first region located between the first and second edges, a second region located between the first region and the first edge, a third region located between the first region and the second edge, a first connection region overlapping with the through vias, a first power pad and a first signal pad disposed on the first region, a second power pad disposed on the second region, a third power pad disposed on the third region, a first redistributed layer pattern connected to the first signal pad to extend onto the first connection region, and a second redistributed layer pattern connecting the first to third power pads to each other and extending onto the first connection region. The second redistributed layer pattern includes a first extension part that extends from the third region to reach the first region. The first extension part has a width which is greater than a width of the first redistributed layer pattern.

According to another embodiment, a stack package includes a lower semiconductor chip disposed on a package substrate, an interposer bridge disposed on the package substrate to be spaced apart from the lower semiconductor chip and configured to include through vias, and an upper semiconductor chip disposed on the lower semiconductor chip to extend onto the interposer bridge and electrically connected to the package substrate by the through vias. The upper semiconductor chip includes a first edge and a second edge which are opposite to each other, a first region located between the first and second edges, a second region located between the first region and the first edge, a third region located between the first region and the second edge, a connection region overlapping with the through vias, a first redistributed layer pattern extending from the first region onto the connection region through the second region, and a second redistributed layer pattern configured to extend from the third region onto the connection region through the first and second regions and configured to have a length which is greater than a length of the first redistributed layer pattern. At least one portion of the second redistributed layer pattern has a width which is greater than a width of the first redistributed layer pattern.

According to another embodiment, a stack package includes a lower semiconductor chip disposed on a package substrate; an interposer bridge disposed on the package substrate to be spaced apart from the lower semiconductor chip and including through vias; and an upper semiconductor chip disposed on the lower semiconductor chip to extend onto the interposer bridge and electrically connected to the package substrate by the through vias. The upper semiconductor chip may include a first edge and a second edge which are opposite to each other; a first region located between the first and second edges; a third region located between the first region and the second edge; a first connection region overlapping with the through vias; a first redistributed layer pattern extending from the first region onto the connection region; and a second redistributed layer pattern configured to extend from the third region onto the connection region through the first region. At least one portion of the second redistributed layer pattern may have a width which is greater than a width of the first redistributed layer pattern.

DETAILED DESCRIPTION

Figure 1:
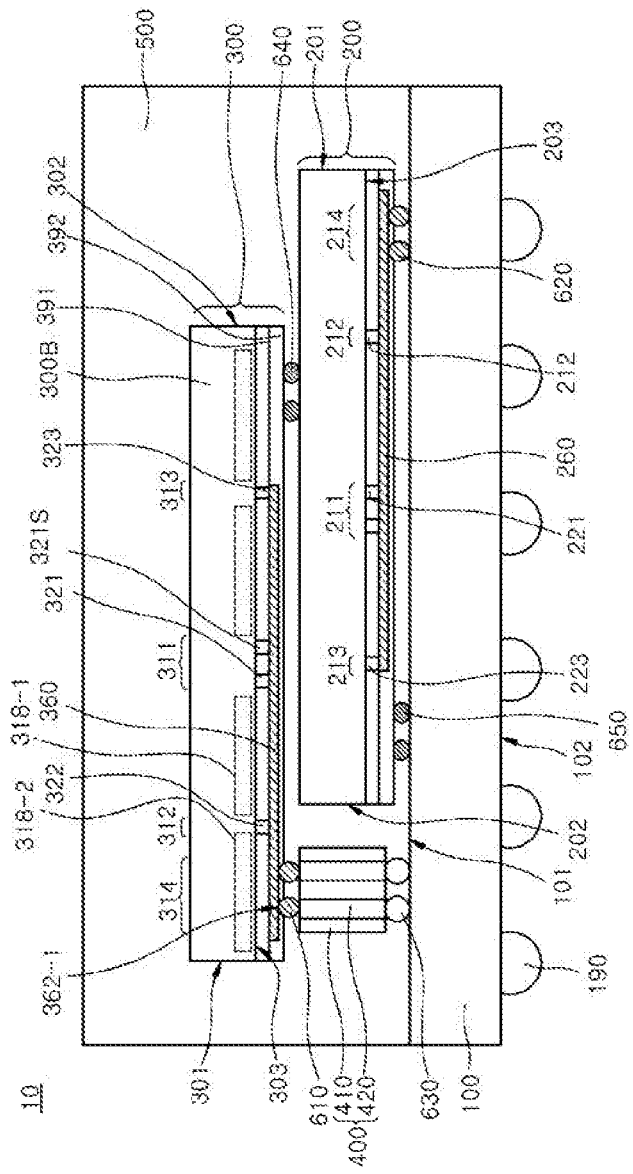
FIG. 1 is a cross-sectional view illustrating a stack package according to an embodiment.

The terms used herein may correspond to words selected in consideration of their functions in the embodiments, and the meanings of the terms may be construed to be different according to ordinary skill in the art to which the embodiments belong. If defined in detail, the terms may be construed according to the definitions. Unless otherwise defined, the terms (including technical and scientific terms) used herein have the same meaning as commonly understood by one of ordinary skill in the art to which the embodiments belong.

It will be understood that although the terms "first," "second," "third" etc. may be used herein to describe various elements, these elements should not be limited by these terms. These terms are only used to distinguish one element from another element, but not used to define only the element itself or to mean a particular sequence.

It will also be understood that when an element or layer is referred to as being "on," "over," "below," "under," or "outside" another element or layer, the element or layer may be in direct contact with the other element or layer, or intervening elements or layers may be present. Other words used to describe the relationship between elements or layers should be interpreted in a like fashion (e.g., "between" versus "directly between" or "adjacent" versus "directly adjacent").

Spatially relative terms, such as "beneath," "below," "lower," "above," "upper," "top," "bottom" and the like, may be used to describe an element and/or feature's relationship to another element(s) and/or feature(s) as, for example, illustrated in the figures. It will be understood that the spatially relative terms are intended to encompass different orientations of the device in use and/or operation in addition to the orientation depicted in the figures. For example, when the device in the figures is turned over, elements described as below and/or beneath other elements or features would then be oriented above the other elements or features. The device may be otherwise oriented (rotated 90 degrees or at other orientations) and the spatially relative descriptors used herein interpreted accordingly.

A stack package may correspond to a semiconductor package, and the semiconductor package may include electronic devices such as semiconductor chips or semiconductor dies. The semiconductor chips or the semiconductor dies may be obtained by separating a semiconductor substrate such as a wafer into a plurality of pieces using a die sawing process. The semiconductor chips may correspond to memory chips, logic chips, or application specific integrated circuits (ASIC) chips. The memory chips may include dynamic random access memory (DRAM) circuits, static random access memory (SRAM) circuits, NAND-type flash memory circuits, NOR-type flash memory circuits, magnetic random access memory (MRAM) circuits, resistive random access memory (ReRAM) circuits, ferroelectric random access memory (FeRAM) circuits or phase change random access memory (PcRAM) circuits which are integrated on the semiconductor substrate. The semiconductor package may be employed in communication systems such as mobile phones, electronic systems associated with biotechnology or health care, or wearable electronic systems. The semiconductor packages may be applicable to internet of things (IoT).

Same reference numerals refer to same elements throughout the specification. Even though a reference numeral is not mentioned or described with reference to a drawing, the reference numeral may be mentioned or described with reference to another drawing. In addition, even though a reference numeral is not shown in a drawing, it may be mentioned or described with reference to another drawing.

FIG. 1 is a cross-sectional view illustrating a stack package 10 according to an embodiment.

Referring to FIG. 1, the stack package 10 may be configured to include a package substrate 100, a lower semiconductor chip 200, an upper semiconductor chip 300, and an interposer bridge 400. In addition, a molding layer 500 may be disposed to protect the lower semiconductor chip 200, the upper semiconductor chip 300, and the interposer bridge 400. The molding layer 500 may be provided by forming an encapsulating material on the package substrate 100 to cover the lower semiconductor chip 200, the upper semiconductor chip 300, and the interposer bridge 400. The molding layer 500 may include an epoxy molding compound (EMC) material.

The package substrate 100 may have a first surface 101 and a second surface 102 which are opposite to each other. The lower semiconductor chip 200, the upper semiconductor chip 300, and the interposer bridge 400 may be disposed on the first surface 101 of the package substrate 100, and outer connectors 190 for connecting the stack package 10 to an external device may be disposed on the second surface 102 of the package substrate 100. The outer connectors 190 may be connection members such as solder balls. The package substrate 100 may be interconnection members for electrically connecting the lower semiconductor chip 200 and the upper semiconductor chip 300 to an external electronic system or an external module. The package substrate 100 may be, for example, a printed circuit board (PCB).

The lower semiconductor chip 200 may be a memory semiconductor chip such as a DRAM chip. The upper semiconductor chip 300 may be a memory semiconductor chip such as a DRAM chip. The upper semiconductor chip 300 may be a semiconductor chip having a function which is different from a function of the lower semiconductor chip 200. Alternatively, the lower semiconductor chip 200 and the upper semiconductor chip 300 may have the same function. The lower semiconductor chip 200 and the upper semiconductor chip 300 may be semiconductor chips having the same configuration.

The lower semiconductor chip 200 may be disposed on the first surface 101 of the package substrate 100. The interposer bridge 400 may be disposed on the first surface 101 of the package substrate 100 to be laterally spaced apart from the lower semiconductor chip 200 by a certain distance. The upper semiconductor chip 300 may be disposed to vertically overlap with the lower semiconductor chip 200 and the interposer bridge 400. The upper semiconductor chip 300 may be stacked on the lower semiconductor chip 200 to be laterally offset relative to the lower semiconductor chip 200 such that a portion of the upper semiconductor chip 300 vertically overlaps with the lower semiconductor chip 200. The upper semiconductor chip 300 may extend onto the interposer bridge 400 such that another portion of the upper semiconductor chip 300 vertically overlaps with the interposer bridge 400.

Figure 2:
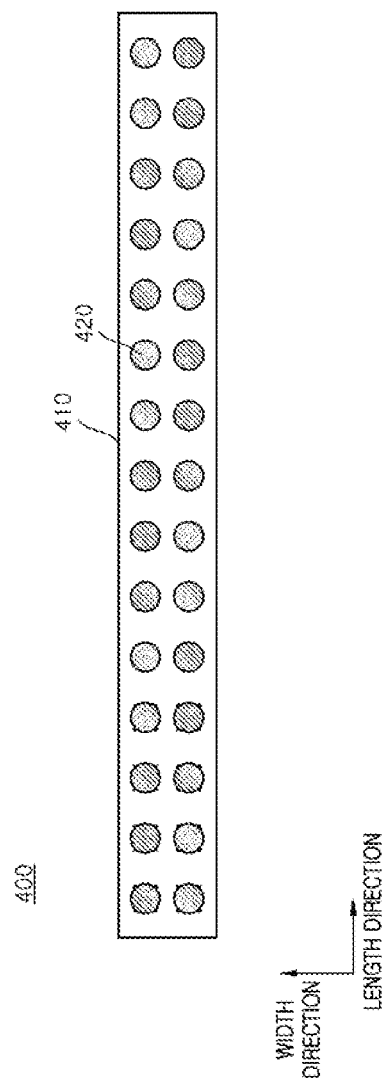
FIG. 2 is a plan view illustrating an interposer bridge of the stack package shown in FIG. 1.

FIG. 2 is a plan view illustrating the interposer bridge 400 of the stack package 10 shown in FIG. 1.

Referring to FIGS. 1 and 2, the interposer bridge 400 may be configured to include a silicon substrate 410 and through vias 420. The through vias 420 may correspond to through silicon vias (TSVs) that substantially penetrate the silicon substrate 410 in a vertical direction. The through vias 420 may be formed to include a conductive material such as copper (Cu). Because the through vias 420 correspond to the TSVs, it may be possible to maximize the number of the through vias 420 disposed in the silicon substrate 410 having a limited planar area. For example, the through vias 420 may be formed to include several tens to several hundreds of vias. In order to increase the number of the through vias 420 disposed in the silicon substrate 410, the through vias 420 may be arrayed in at least two columns which are parallel with a length direction of the silicon substrate 410.

The interposer bridge 400 may correspond to an interconnection member electrically connecting the upper semiconductor chip 300 to the package substrate 100. The upper semiconductor chip 300 may be electrically connected to the package substrate 100 through the through vias 420 of the interposer bridge 400. The interposer bridge 400 may also act as a supporting member that supports the upper semiconductor chip 300 together with the lower semiconductor chip 200. The interposer bridge 400 may be provided in a chip form or a die form including the silicon substrate 410 in which the through vias 420 are disposed. The interposer bridge 400 may be coupled to the package substrate 100 through third connectors 630. The third connectors 630 may be connection members having a bump form. The interposer bridge 400 may be bonded to the package substrate 100 by attaching bumps to the through vias 420 of the interposer bridge 400 and by bonding the bumps to the package substrate 100.

Figure 3:
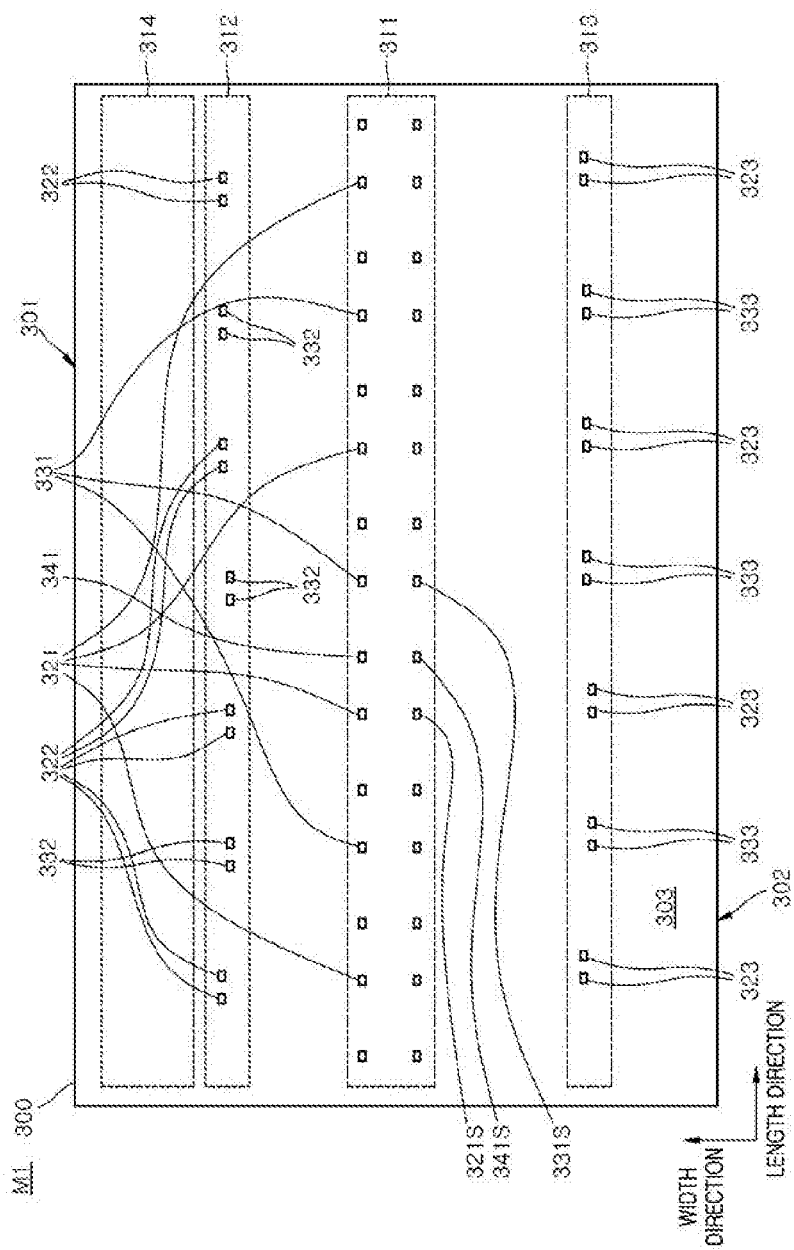
FIG. 3 is a plan view illustrating a chip pad array of an upper semiconductor chip included in the stack package of FIG. 1.

FIG. 3 is a plan view illustrating an array M1 of chip pads of the upper semiconductor chip 300 included in the stack package 10 of FIG. 1.

Referring to FIGS. 1 and 3, the upper semiconductor chip 300 may include a first edge 301 and a second edge 302 which are opposite to each other. The upper semiconductor chip 300 may also include a surface 303 which is defined by the first and second edges 301 and 302. The surface 303 of the upper semiconductor chip 300 may include a first region 311, a second region 312, a third region 313, and a first connection region 314. The first region 311, the second region 312, the third region 313, and the first connection region 314 may be set as separate regions which are spaced apart from each other.

The first region 311 of the upper semiconductor chip 300 may be located between the first edge 301 and the second edge 302. The first region 311 of the upper semiconductor chip 300 may be located at a central position which is spaced apart from the first edge 301 and the second edge 302 by the same distance. When the upper semiconductor chip 300 is a memory chip, the first region 311 of the upper semiconductor chip 300 may be defined as a peripheral region in which peripheral circuits of the memory chip are disposed.

The second region 312 of the upper semiconductor chip 300 may be located between the first region 311 and the first edge 301. The second region 312 of the upper semiconductor chip 300 may be located to be spaced apart from the first region 311 and the first edge 301. A distance between the second region 312 and the first edge 301 may be less than a distance between the second region 312 and the first region 311.

The third region 313 of the upper semiconductor chip 300 may be located between the first region 311 and the second edge 302. The third region 313 of the upper semiconductor chip 300 may be located to be spaced apart from the first region 311 and the second edge 302. A distance between the third region 313 and the second edge 302 may be less than a distance between the third region 313 and the first region 311. The third region 313 of the upper semiconductor chip 300 may be located at a side of the first region 311 opposite to the second region 312.

The upper semiconductor chip 300 may include chip pads disposed on the surface 303, and the chip pads disposed on the surface 303 may act as connection terminals for electrically connecting the upper semiconductor chip 300 to another element. The chip pads may be disposed on all of the first, second and third regions 311, 312 and 313. The chip pads disposed on the surface 303 may include power pads for applying a power supply voltage to the upper semiconductor chip 300, signal pads for transmitting various signals to the upper semiconductor chip 300, and ground pads for applying a ground voltage to the upper semiconductor chip 300.

First power pads 321 of the chip pads may be disposed on the first region 311 of the upper semiconductor chip 300. The first power pads 321 may be arrayed along a length direction of the first region 311. The length direction of the first region 311 may be substantially perpendicular to a line extending from the first edge 301 toward the second edge 302 in a plan view of FIG. 3. Other first power pads 321S may be additionally arrayed in the first region 311 along the length direction of the first region 311. In such case, the first power pads 321 may be arrayed in a first row parallel with the length direction of the first region 311, and the other first power pads 321S may be arrayed in a second row which is spaced apart from and parallel with the first row.

First ground pads 331 of the chip pads may be disposed on the first region 311 of the upper semiconductor chip 300. The first ground pads 331 may be arrayed along the length direction of the first region 311. Other first ground pads 331S may be additionally arrayed in the first region 311 along the length direction of the first region 311. In such a case, the first ground pads 331 may be arrayed in the first row parallel with the length direction of the first region 311, and the other first ground pads 331S may be arrayed in the second row which is spaced apart from and parallel with the first row.

First signal pads 341 of the chip pads may be disposed on the first region 311 of the upper semiconductor chip 300. The first signal pads 341 may be arrayed along the length direction of the first region 311. Other first signal pads 341S may be additionally arrayed in the first region 311 along the length direction of the first region 311. In such a case, the first signal pads 341 may be arrayed in the first row parallel with the length direction of the first region 311, and the other first signal pads 341S may be arrayed in the second row which is spaced apart from and parallel with the first row.

The first power pads 321, the first signal pads 341, and the first ground pads 331 may be repeatedly arrayed along the length direction of the first region 311 in order of the first power pad 321, the first signal pad 341, and the first ground pad 331. Each of the first power pads 321 may be disposed between two adjacent ones of the first signal pads 341 arrayed along the length direction of the first region 311. Each of the first ground pads 331 may be disposed between two adjacent ones of the first signal pads 341 arrayed along the length direction of the first region 311.

In the first power pad 321, the first signal pad 341, and the first ground pad 331 disposed to be adjacent to each other along the length direction of the first region 311, the first ground pad 331 may be disposed at a side of the first signal pad 341 opposite to the first power pad 321. In the first power pad 321, the first signal pad 341, and the first ground pad 331 disposed to be adjacent to each other along the length direction of the first region 311, the first power pad 321 and the first ground pad 331 may be disposed at both sides of the first signal pad 341, respectively. As such, because the first power pad 321, the first signal pad 341, and the first ground pad 331 are disposed to be adjacent to each other along the length direction of the first region 311, a routing distance between a data signal, a power supply voltage signal, and a ground voltage signal may be reduced to improve an operation speed of the upper semiconductor chip 300.

Second power pads 322 of the chip pads may disposed on the second region 312 of the upper semiconductor chip 300. The second power pads 322 may be arrayed along a length direction of the second region 312. The length direction of the second region 312 may be substantially perpendicular to a line extending from the first edge 301 toward the second edge 302 in a plan view of FIG. 3.

Second ground pads 332 may also be disposed on the second region 312 of the upper semiconductor chip 300. The second ground pads 332 may be arrayed along the length direction of the second region 312.

Third power pads 323 of the chip pads may disposed on the third region 313 of the upper semiconductor chip 300. The third power pads 323 may be arrayed along a length direction of the third region 313. The length direction of the third region 313 may be substantially perpendicular to a line extending from the first edge 301 toward the second edge 302 in a plan view of FIG. 3.

Third ground pads 333 may also be disposed on the third region 313 of the upper semiconductor chip 300. The third ground pads 333 may be arrayed along the length direction of the third region 313.

The first connection region 314 may be defined as portion of the surface 303 of the upper semiconductor chip 300. The first connection region 314 of the upper semiconductor chip 300 may be a region to which the through vias 420 of the interposer bridge 400 are connected. The first connection region 314 of the upper semiconductor chip 300 may be a region overlapping with the through vias 420 of the interposer bridge 400. Because the through vias 420 of the interposer bridge 400 are connected to the connection region 314 of the upper semiconductor chip 300, the upper semiconductor chip 300 may be stacked on the lower semiconductor chip 200 to be laterally offset relative to the lower semiconductor chip 200 so that a portion (including the connection region 314) of the upper semiconductor chip 300 laterally protrudes from a side surface of the lower semiconductor chip 200. The first region 311 and the third region 313 of the upper semiconductor chip 300 may overlap with the lower semiconductor chip 200.

The first connection region 314 of the upper semiconductor chip 300 may be disposed to be spaced apart from the first region 311 such that a distance between the first connection region 314 and the first edge 301 is less than a distance between the first connection region 314 and first region 311. The first connection region 314 of the upper semiconductor chip 300 may be disposed to be adjacent to the first edge 301 such that a distance between the first connection region 314 and the first edge 301 is less than a distance between the first connection region 314 and the second region 312. Although nor shown in the drawings, the first connection region 314 of the upper semiconductor chip 300 may be disposed to overlap with the second region 312.

Figure 4:
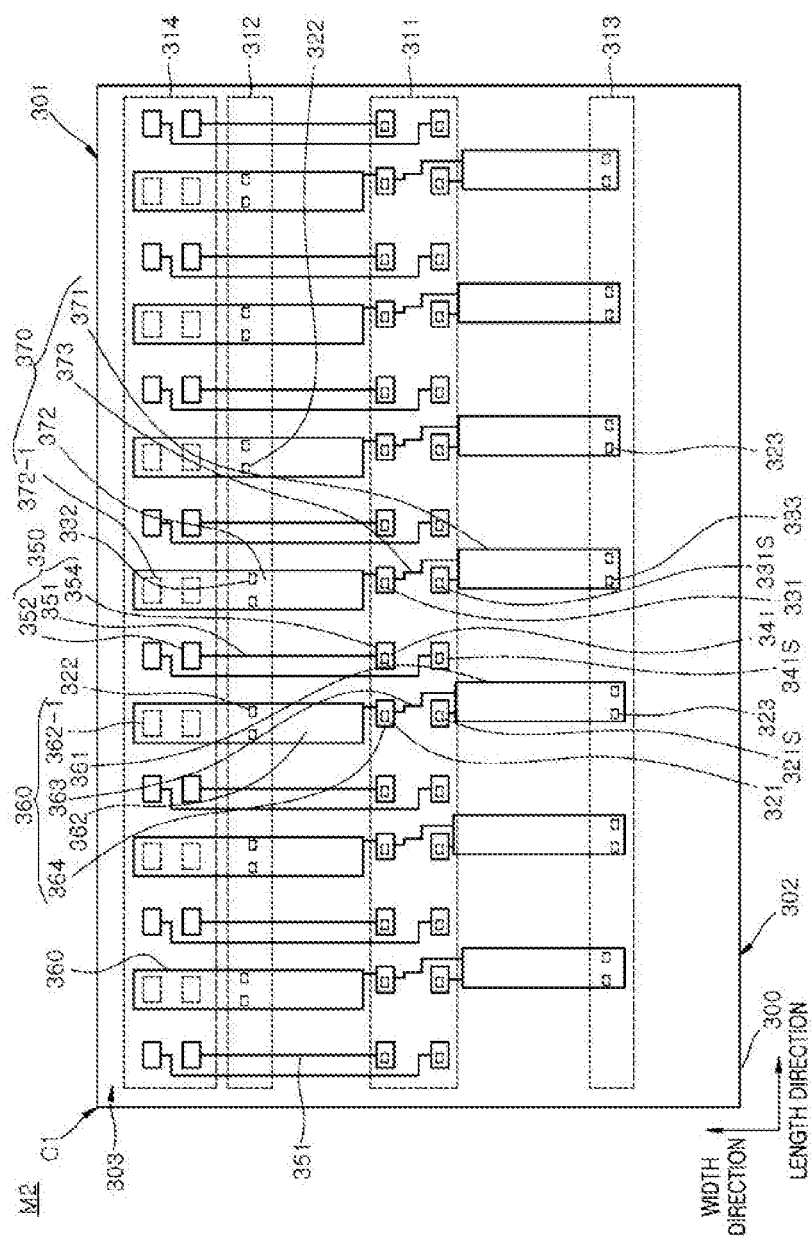
FIG. 4 is a plan view illustrating a redistributed layer pattern array of an upper semiconductor chip included in the stack package of FIG. 1.
Figure 5:
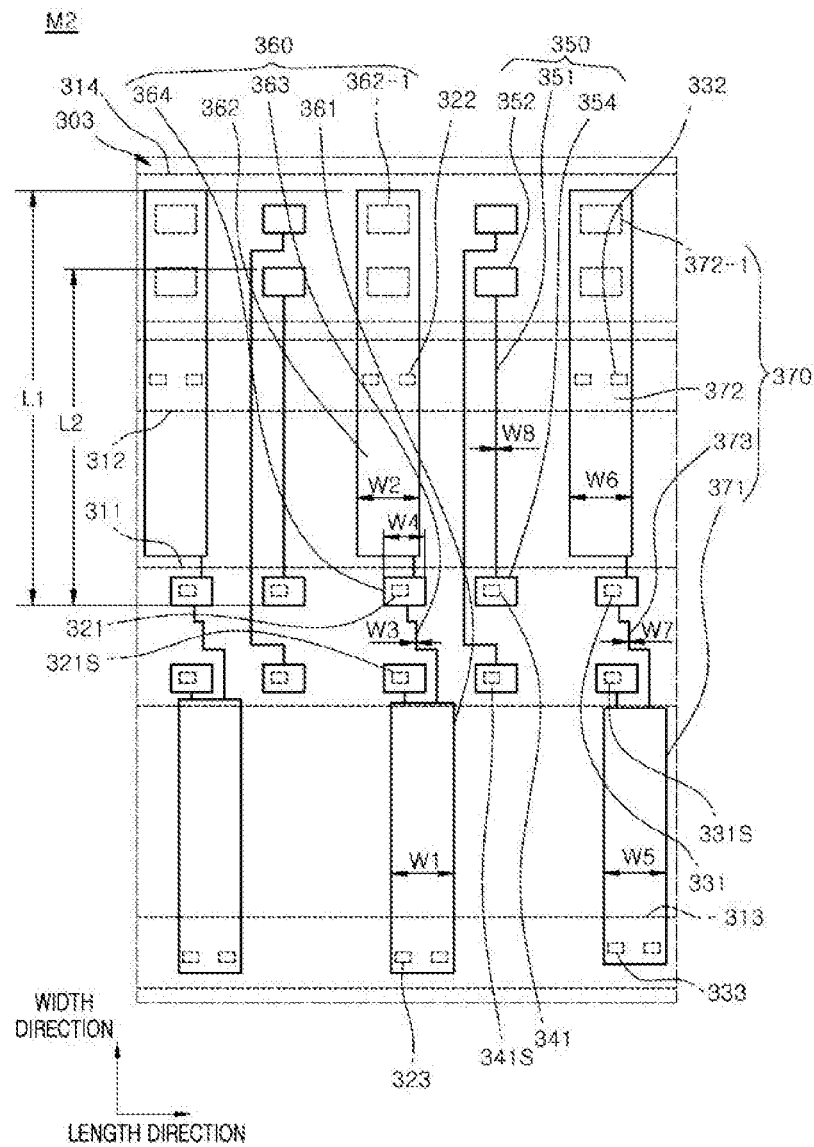
FIG. 5 is an enlarged view of a portion of FIG. 4

FIG. 4 is a plan view illustrating a redistributed layer pattern array M2 of the upper semiconductor chip 300 included in the stack package 10 of FIG. 1. FIG. 5 is an enlarged view of a portion of FIG. 4.

Referring to FIGS. 1, 4 and 5, the upper semiconductor chip 300 may include redistributed layer patterns disposed on the surface 303. The redistributed layer patterns may be conductive patterns for electrically extending the chip pads onto the first connection region 314.

First redistributed layer patterns 350 of the redistributed layer patterns may be connected to the first signal pads 341 and may extend onto the first connection region 314. The first redistributed layer patterns 350 may be conductive patterns that extend from the first region 311 to reach the first connection region 314 through the second region 312.

Second redistributed layer patterns 360 of the redistributed layer patterns may be conductive patterns connecting the first, second, and third power pads 321, 322 and 323 to each other and extending onto the first connection region 314. The second redistributed layer patterns 360 may be conductive patterns that extend from the third region 313 to reach the first connection region 314 through the first and second regions 311 and 312. Thus, the second redistributed layer patterns 360 of a length L1 may be longer than the first redistributed layer patterns 350 of a length L2. The second redistributed layer patterns 360 may be conductive patterns that extend to connect the first, second, and third power pads 321, 322 and 323, which are disposed on respective ones of the first, second, and third regions 311, 312, and 313, to each other.

Third redistributed layer patterns 370 of the redistributed layer patterns may be conductive patterns connecting the first, second, and third ground pads 331, 332 and 333 to each other and extending onto the first connection region 314. The third redistributed layer patterns 370 may be conductive patterns that extend from the third region 313 to reach the first connection region 314 through the first and second regions 311 and 312. Thus, the third redistributed layer patterns 370 may be longer than the first redistributed layer patterns 350.

Each of the second redistributed layer patterns 360 may include a first extension part 361 that extends from the third region 313 to reach the first region 311. The first extension part 361 of the second redistributed layer pattern 360 may cover at least one of the third power pads 323 and may be electrically connected to the at least one of the third power pads 323. Each of the second redistributed layer patterns 360 may further include a second extension part 362 that extends from the first region 311 onto the first connection region 314 through the second region 312. The second extension part 362 of the second redistributed layer pattern 360 may cover at least one of the second power pads 322 and may be electrically connected to the at least one of the second power pads 322.

The second extension part 362 of the second redistributed layer pattern 360 may include a first contact region 362-1 located in the first connection region 314. The first contact region 362-1 of the second extension part 362 of each of the second redistributed layer patterns 360 may correspond to a portion to which one of first inner connectors 610 is bonded. The first inner connectors 610 may be bumps. The first inner connectors 610 may be disposed between the first connection region 314 of the upper semiconductor chip 300 and the through vias 420 to electrically connect the through vias 420 of the interposer bridge 400 to the first contact regions 362-1 of the second extension parts 362.

Each of the second redistributed layer patterns 360 may further include a third extension part 363 that connects one of the second extension parts 362 to one of the first extension parts 361. The first extension parts 361 and the second extension parts 362 of the second redistributed layer patterns 360 may have widths W1, W2 which are greater than a width W3 of the third extension part 363. The third extension part 363 may be a conductive line having the width W3 which is less than the widths W1, W2 of the first extension parts 361 and the second extension parts 362. Each of the second redistributed layer patterns 360 may further include a first overlap part 364 that overlaps with one of the first power pads 321 disposed on the first region 311, and the first overlap part 364 may have a width W4 which is greater than the width W3 of the third extension part 363 to fully cover the first power pads 321.

Each of the first redistributed layer patterns 350 may include a second overlap part 354 that covers one of the first signal pads 341 disposed on the first region 311. Each of the first redistributed layer patterns 350 may further include a second contact pad 352 disposed on the first contact region 314. The second contact pad 352 may be bonded to one of the first inner connectors 610. Each of the first redistributed layer patterns 350 may further include an extension part 351 connecting the second contact pad 352 to the second overlap part 354.

The second redistributed layer patterns 360 may extend to be longer than the first redistributed layer patterns 350. The second redistributed layer patterns 360 may extend from the first connection region 314 to reach the third region 313, thereby having a relatively high resistance value and a relatively high impedance value. At least one portion of each of the second redistributed layer patterns 360 may be formed to be wider than the first redistributed layer patterns 350. For example, the first extension parts 361 and the second extension parts 362 of the second redistributed layer patterns 360 may be formed to be wider than a width W8 of the extension parts 351 of the first redistributed layer patterns 350. Thus, a resistance value and an impedance value of the second redistributed layer patterns 360 may be reduced because of the presence of the first extension parts 361 and the second extension parts 362 of the second redistributed layer patterns 360. Accordingly, the first extension parts 361 and the second extension parts 362 of the second redistributed layer patterns 360 may offset or suppress that a resistance value and an impedance value of the second redistributed layer patterns 360 increase due to a large length of the second redistributed layer patterns 360. As a result, the first extension parts 361 and the second extension parts 362 of the second redistributed layer patterns 360 may provide an effect improving a power delivery network.

Each of the third redistributed layer patterns 370 may include a fifth extension part 371 that extends from the third region 313 to reach the first region 311. The fifth extension part 371 of the third redistributed layer pattern 370 may cover at least one of the third ground pads 333 and may be electrically connected to the at least one of the third ground pads 333. Each of the third redistributed layer patterns 370 may further include a sixth extension part 372 that extends from the first region 311 onto the first connection region 314 through the second region 312. The sixth extension part 372 of the third redistributed layer pattern 370 may cover at least one of the second ground pads 332 and may be electrically connected to the at least one of the second ground pads 332.

The sixth extension part 372 of the third redistributed layer pattern 370 may include a third contact region 372-1 located in the first connection region 314. The third contact region 372-1 of the sixth extension part 372 of each of the third redistributed layer patterns 370 may correspond to a portion to which one of the first inner connectors 610 is bonded.

Each of the third redistributed layer patterns 370 may further include a seventh extension part 373 that connects one of the sixth extension parts 372 to one of the fifth extension parts 371. The fifth extension parts 371 and the sixth extension parts 372 of the third redistributed layer patterns 370 may have widths W5, W6 which are greater than a width W7 of the seventh extension part 373.

At least one portion of each of the third redistributed layer patterns 370 may be formed to be wider than the first redistributed layer patterns 350. For example, the fifth extension parts 371 and the sixth extension parts 372 of the third redistributed layer patterns 370 may be formed to be wider than the extension parts 351 of the first redistributed layer patterns 350.

As described above, the third redistributed layer patterns 370 may be formed to have substantially the same shape as the second redistributed layer patterns 360. In the first redistributed layer pattern 350, the second redistributed layer pattern 360, and the third redistributed layer pattern 370 adjacent to each other, the third redistributed layer pattern 370 may be disposed at a side of the first redistributed layer pattern 350 opposite to the second redistributed layer pattern 360.

Referring again to FIG. 1, the upper semiconductor chip 300 may further include a first dielectric layer 391 and a second dielectric layer 392 that covers the surface 303 corresponding to a surface of a chip body 300B of the upper semiconductor chip 300. The first dielectric layer 391 may be disposed to protect the surface 303 of the chip body 300B. The second dielectric layer 392 may cover the redistributed layer patterns (350, 360 and 370 of FIG. 4) to electrically insulate the redistributed layer patterns from each other.

The upper semiconductor chip 300 may be coupled to the through vias 420 of the interposer bridge 400 by the first inner connectors 610. The first connection region 314 of the upper semiconductor chip 300 may be closer to the first edge 301 than the second edge 302 and may be coupled to the first inner connectors 610. Thus, a portion of the upper semiconductor chip 300 adjacent to the second edge 302 may be supported by first supporting bumps 640.

The first supporting bumps 640 may be disposed between the lower semiconductor chip 200 and the upper semiconductor chip 300 to balance the upper semiconductor chip 300 and to prevent the upper semiconductor chip 300 from inclining. The first supporting bumps 640 may be substantially the same conductive bumps as the first inner connectors 610. Alternatively, it is unnecessary that the first supporting bumps 640 are formed of a conductive material. Thus, the first supporting bumps 640 may be insulation bumps or insulation balls which are formed of an insulation material such as a polymer material or a resin material. The first supporting bumps 640 may be bonded to a surface of the second dielectric layer 392 of the upper semiconductor chip 300.

Figure 6:
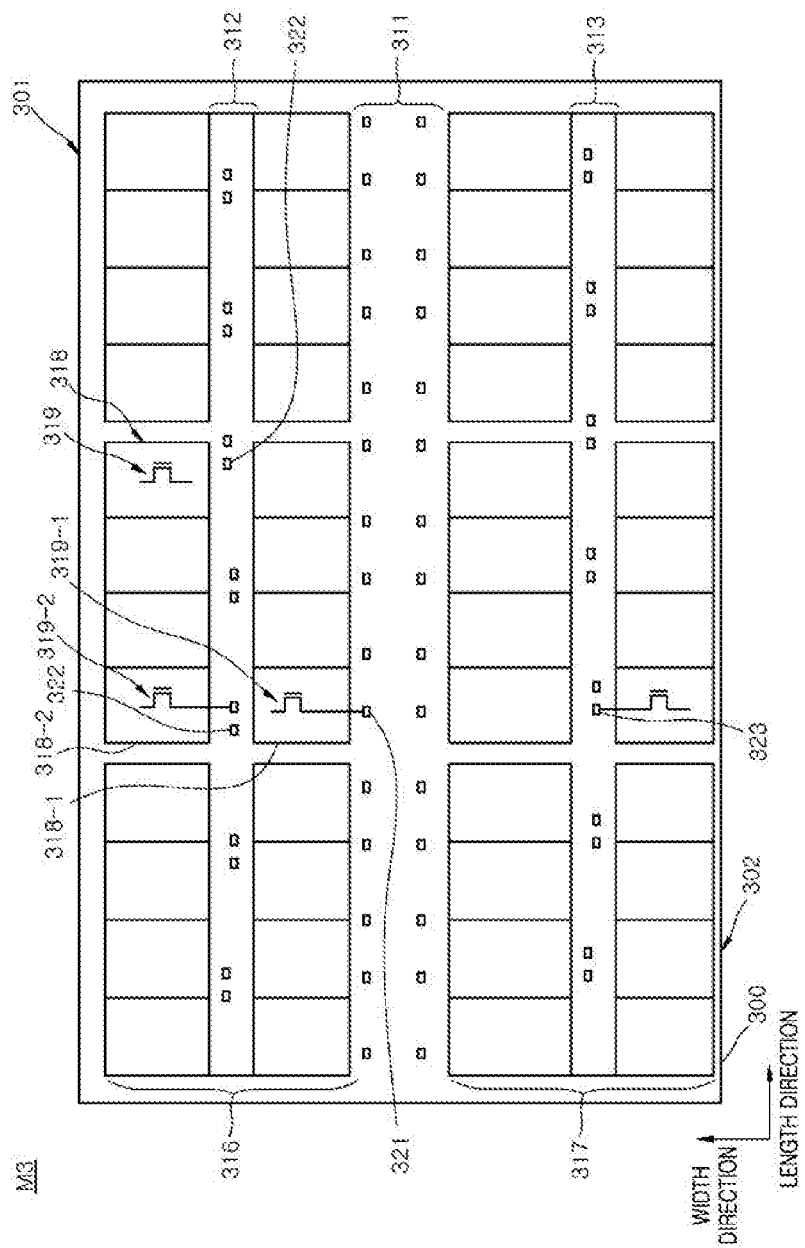
FIG. 6 is a plan view illustrating cell matrix regions of an upper semiconductor chip included in the stack package of FIG. 1.

FIG. 6 is a plan view illustrating a cell matrix region array M3 of the upper semiconductor chip 300 included in the stack package 10 of FIG. 1.

Referring to FIGS. 1, 4, 5 and 6, a first core region 316 may be disposed between the first region 311 and the first edge 301 of the upper semiconductor chip 300, and a second core region 317 may be disposed between the first region 311 and the second edge 302 of the upper semiconductor chip 300. When the upper semiconductor chip 300 is a memory chip, each of the first and second core regions 316 and 317 may be a region in which memory cells 319 are arrayed. The first region 311 of the upper semiconductor chip 300 may be a peripheral region in which peripheral circuits for controlling the memory cells 319 are disposed. Each of the first and second core regions 316 and 317 may be a region in which a plurality of cell matrix regions 318 are disposed. The cell matrix region 318 may correspond to a memory bank. A layout illustrated in FIG. 6 may be merely an example of the upper semiconductor chip 300. In general, 16 memory banks may be arrayed in one row, and 32 memory banks may be disposed in a first core region. Each of the memory cells 319 disposed in the cell matrix region 318 may include a transistor and a capacitor.

The first power pads 321 disposed on the first region 311 of the upper semiconductor chip 300 may be disposed to apply a power supply voltage to first memory cells 319-1 located in first cell matrix regions 318-1 disposed to be adjacent to the first region 311. The second power pads 322 disposed on the second region 312 of the upper semiconductor chip 300 may be disposed to apply the power supply voltage to second memory cells 319-2 located in second cell matrix regions 318-2 disposed between the second region 312 and the first edge 301.

Because the second memory cells 319-2 receive the power supply voltage from the second power pads 322 located in the second region 312, a voltage drop across power lines between the second power pads 322 and the second memory cells 319-2 may be reduced as compared with a case that the second memory cells 319-2 receive the power supply voltage from the first power pads 321 located in the first region 311. That is, because the second memory cells 319-2 receive the power supply voltage from the second power pads 322 located in the second region 312 between the first cell matrix region 318-1 and the second cell matrix region 318-2, the power supply voltage applied to the second memory cells 319-2 may be maximized.

As described with reference to FIG. 3, the second and third power pads 322 and 323 may also be uniformly disposed even in the second and third regions 312 and 313 except the first region 311 corresponding to the peripheral region. Thus, it may be possible to maximize a level of the power supply voltage applied to all of the memory cells 319 of the upper semiconductor chip 300.

Figure 7:
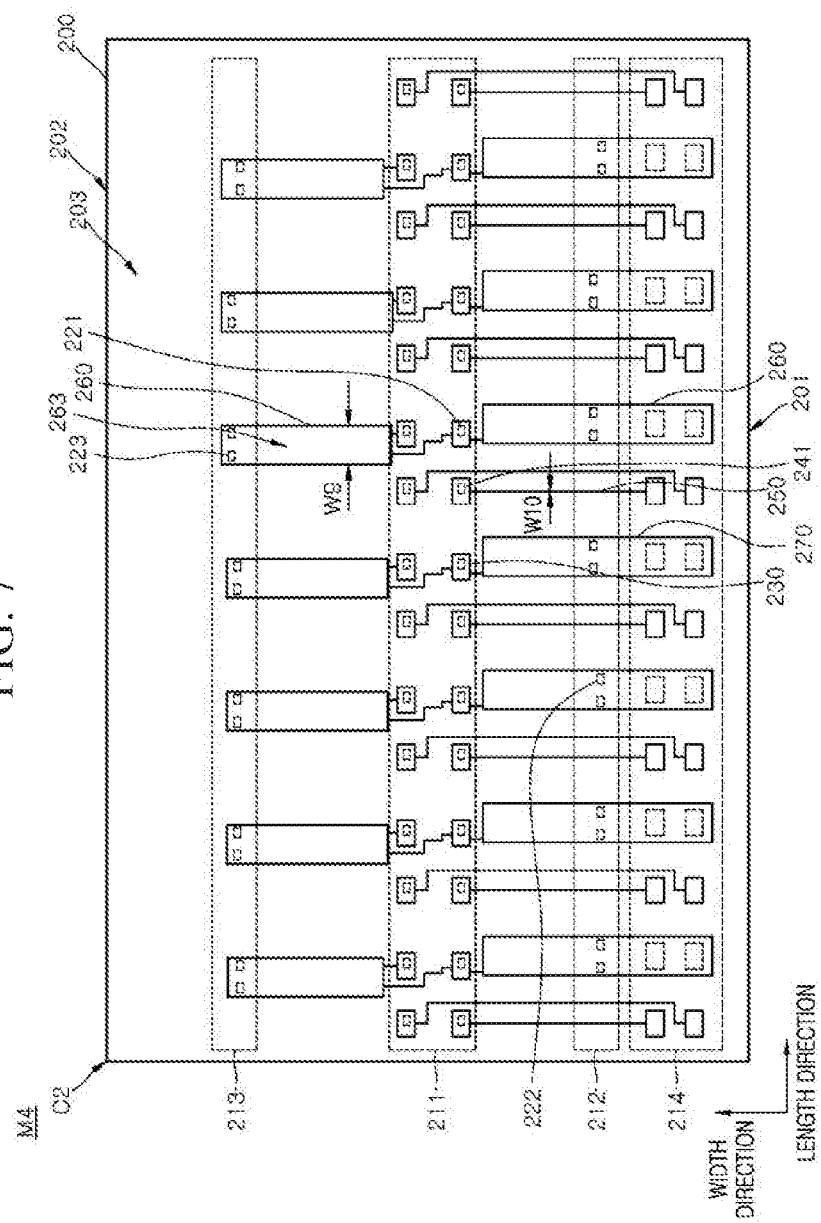
FIG. 7 is a plan view illustrating an array M4 of redistributed layer patterns and chip pads of a lower semiconductor chip included in the stack package of FIG. 1.

FIG. 7 is a plan view illustrating an array M4 of the redistributed layer patterns and the chip pads of the lower semiconductor chip 200 included in the stack package 10 of FIG. 1.

Referring to FIGS. 1 and 7, the lower semiconductor chip 200 may include redistributed layer patterns and chip pads having substantially the same layout as the redistributed layer patterns and the chip pads of the upper semiconductor chip 300. The lower semiconductor chip 200 may have a third edge 201 and a fourth edge 202 which are opposite to each other and may have a surface 203 which is defined by the third and fourth edges 201 and 202.

The surface 203 of the lower semiconductor chip 200 may include a fourth region 211, a fifth region 212, a sixth region 213, and a second connection region 214. The fourth region 211, the fifth region 212, the sixth region 213, and the second connection region 214 may be set as separate regions which are spaced apart from each other. The fourth region 211 of the lower semiconductor chip 200 may be located between the third edge 201 and the fourth edge 202. The fourth region 211 located at a central region between the third edge 201 and the fourth edge 202 of the lower semiconductor chip 200 may be a peripheral region of a memory chip. The fifth region 212 of the lower semiconductor chip 200 may be located between the fourth region 211 and the third edge 201. The sixth region 213 of the lower semiconductor chip 200 may be located between the fourth region 211 and the fourth edge 202. A distance between the second connection region 214 and the third edge 201 may be less than a distance between the second connection region 214 and the fifth region 212.

Fourth power pads 221 and second signal pads 241 may be disposed on the fourth region 211 of the lower semiconductor chip 200. Fifth power pads 222 may be disposed on the fifth region 212 of the lower semiconductor chip 200. Sixth power pads 223 may be disposed on the sixth region 213 of the lower semiconductor chip 200.

Fourth redistributed layer patterns 250 may be connected to the second signal pads 241 and may extend onto the second connection region 214. The fourth redistributed layer patterns 250 may have substantially the same shape as the first redistributed layer patterns (350 of FIG. 4) of the upper semiconductor chip (300 of FIG. 4) and may be arrayed in the same way as the first redistributed layer patterns 350.

Fifth redistributed layer patterns 260 may be disposed to connect the fourth, fifth, and sixth power pads 221, 222 and 223 to each other and to extend onto the second connection region 214. The fifth redistributed layer patterns 260 may have substantially the same shape as the second redistributed layer patterns (360 of FIG. 4) of the upper semiconductor chip (300 of FIG. 4) and may be arrayed in the same way as the second redistributed layer patterns 360. A layout of the array M4 of the patterns illustrated in FIG. 7 may be substantially identical to a layout that the array M2 illustrated in FIG. 4 is rotated by 180 degrees. That is, if a layout of the array M2 illustrated in FIG. 4 is rotated by 180 degrees such that a reference corner C1 of the layout of the array M2 is located at a reference corner C2 of the layout of the array M4 illustrated in FIG. 7, the rotated layout of the array M2 illustrated in FIG. 4 may be substantially the same as the layout of the array M4 illustrated in FIG. 7.

Fourth extension parts 263 of the fifth redistributed layer patterns 260 may have a width W9 which is greater than a width W10 of the fourth redistributed layer patterns 250. The fourth extension part 263 of the fifth redistributed layer patterns 260 may be conductive patterns that extend from the sixth region 213 to reach the fourth region 211.

Ground pads 230 may also be disposed on the fourth, fifth, and sixth regions 211, 212, and 213. Sixth redistributed layer patterns 270 may be disposed to connect the ground pads 230 located in the fourth, fifth, and sixth regions 211, 212, and 213 to each other and to extend onto the second connection region 214. The sixth redistributed layer patterns 270 may have substantially the same shape as the third redistributed layer patterns (370 of FIG. 4) of the upper semiconductor chip (300 of FIG. 4) and may be arrayed in the same way as the third redistributed layer patterns 370.

Referring again to FIG. 1, second inner connectors 620 may be disposed between the lower semiconductor chip 200 and the package substrate 100 to overlap with the second connection region 214 of the lower semiconductor chip 200. The second inner connectors 620 may be connection members electrically connecting the lower semiconductor chip 200 to the package substrate 100. The second inner connectors 620 may be formed of the same conductive bumps as the first inner connectors 610.

The second inner connectors 620 may be disposed to overlap with the second connection region 214 adjacent to the third edge 201 of the lower semiconductor chip 200. Second supporting bumps 650 may be additionally disposed between a portion of the lower semiconductor chip 200 and the package substrate 100 to balance the lower semiconductor chip 200 and to prevent the lower semiconductor chip 200 from inclining. The second supporting bumps 650 may be disposed to be closer to the fourth edge 202 of the lower semiconductor chip 200 than the second inner connectors 620. That is, a distance between the fourth edge 202 of the lower semiconductor chip 200 and the second supporting bumps 650 may be less than a distance between the fourth edge 202 of the lower semiconductor chip 200 and the second inner connectors 620. The second supporting bumps 650 may be dummy bumps such as insulation bumps like the first supporting bumps 640.

Figure 8:
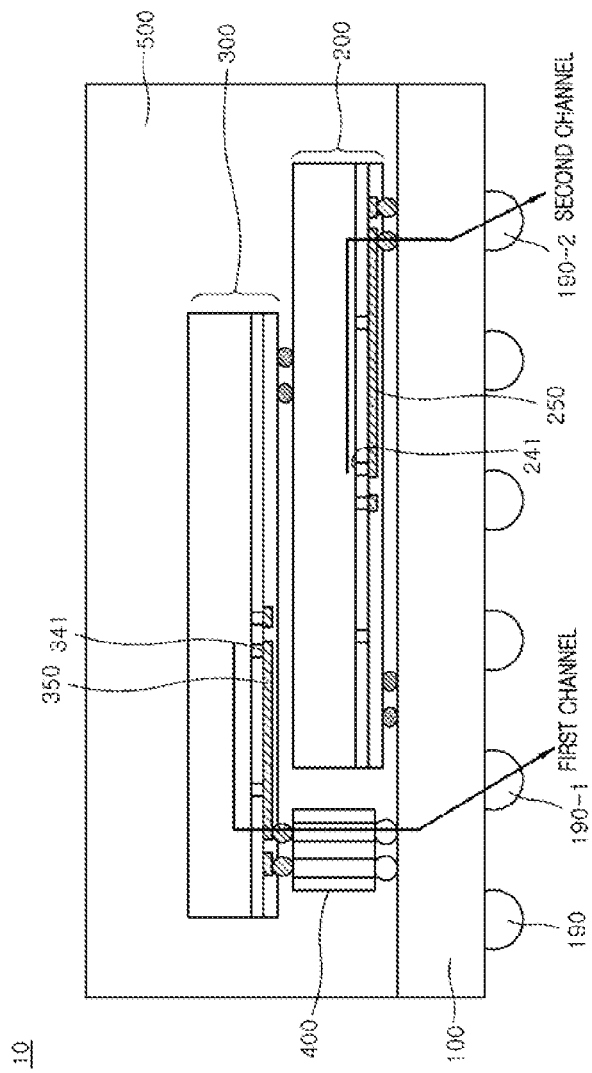
FIG. 8 is a cross-sectional view illustrating signal channels of the stack package shown in FIG. 1.

FIG. 8 is a cross-sectional view illustrating signal channels of the stack package 10 shown in FIG. 1.

Referring to FIG. 8, the upper semiconductor chip 300 of the stack package 10 may communicate with an external device (not shown) through a first signal channel comprised of the first redistributed layer patterns 350, the interposer bridge 400, and first outer connectors 190-1 of the package substrate 100. The lower semiconductor chip 200 of the stack package 10 may communicate with the external device through a second signal channel comprised of the fourth redistributed layer patterns 250 and second outer connectors 190-2 of the package substrate 100. The first outer connectors 190-1 and the second outer connectors 190-2 may constitute outer connectors 190 to which electrical signals are independently applied. The upper semiconductor chip 300 and the lower semiconductor chip 200 may communicate with the external device through the first and second signal channels that function independently.

Figure 9:
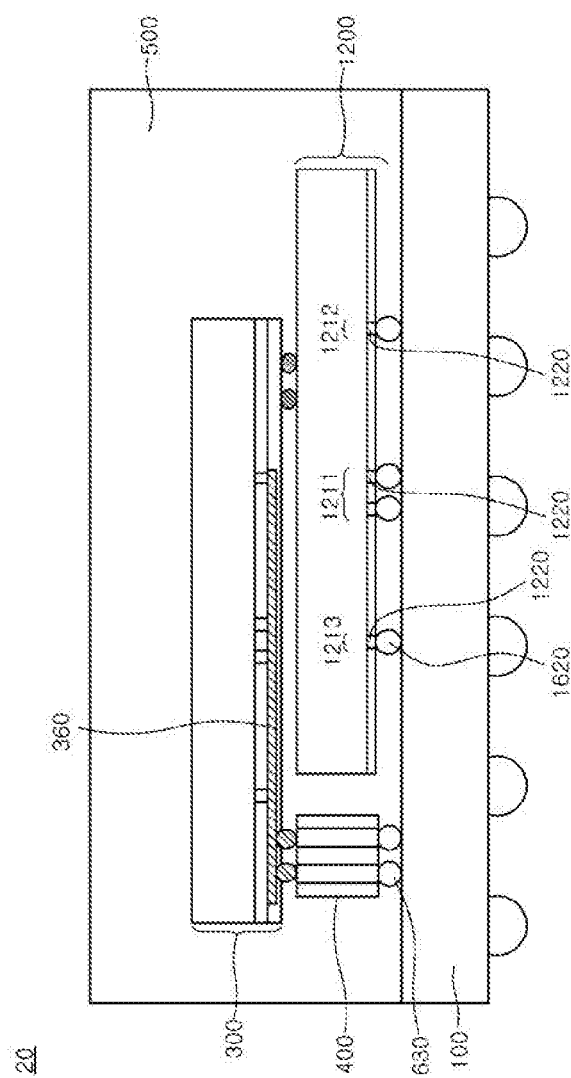
FIG. 9 is a cross-sectional view illustrating a stack package according to another embodiment.

FIG. 9 is a cross-sectional view illustrating a stack package 20 according to another embodiment. In FIG. 9, the same reference numerals as used in FIG. 1 denote the same elements.

Referring to FIG. 9, the stack package 20 may be configured to include a lower semiconductor chip 1200 and the upper semiconductor chip 300 which are sequentially stacked on the package substrate 100. The upper semiconductor chip 300 may be configured to include the second redistributed layer patterns 360 illustrated in FIGS. 1 and 4. The lower semiconductor chip 1200 might not include any redistributed layer patterns such as the fifth redistributed layer patterns (260 of FIG. 1), apart from the lower semiconductor chip (200 of FIG. 1) of the stack package (10 of FIG. 1) according to an embodiment. Thus, fourth inner connectors 1620 electrically connecting the lower semiconductor chip 1200 to the package substrate 100 may be directly connected or bonded to chip pads 1220 of the lower semiconductor chip 1200. The chip pads 1220 of the lower semiconductor chip 1200 may be disposed on all of a first region 1211, a second region 1212, and a third region 1213.

Figure 10:
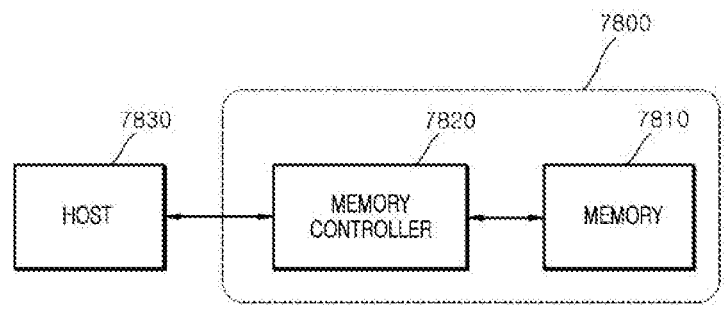
FIG. 10 is a block diagram illustrating an electronic system employing a memory card including at least one of stack packages according to the embodiments.

FIG. 10 is a block diagram illustrating an electronic system including a memory card 7800 employing at least one of the stack packages according to the embodiments. The memory card 7800 includes a memory 7810 such as a nonvolatile memory device, and a memory controller 7820. The memory 7810 and the memory controller 7820 may store data or read out the stored data. At least one of the memory 7810 and the memory controller 7820 may include at least one of the stack packages according to the embodiments.

The memory 7810 may include a nonvolatile memory device to which the technology of the embodiments of the present disclosure is applied. The memory controller 7820 may control the memory 7810 such that stored data is read out or data is stored in response to a read/write request from a host 7830.

Figure 11:
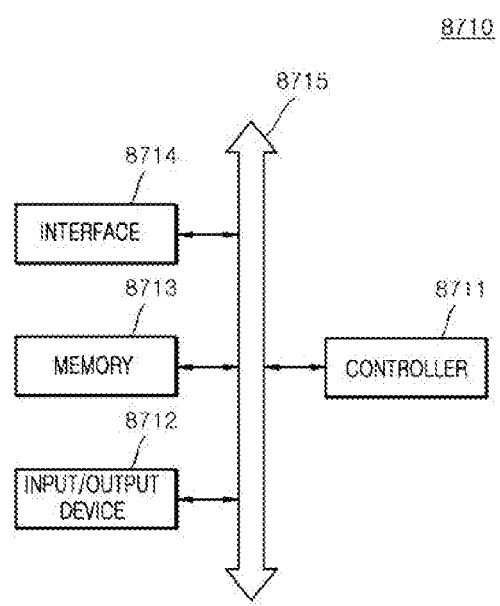
FIG. 11 is a block diagram illustrating another electronic system including at least one of stack packages according to the embodiments.

FIG. 11 is a block diagram illustrating an electronic system 8710 including at least one of the stack packages according to the embodiments. The electronic system 8710 may include a controller 8711, an input/output unit 8712 and a memory 8713. The controller 8711, the input/output unit 8712 and the memory 8713 may be coupled with one another through a bus 8715 providing a path through which data move.

In an embodiment, the controller 8711 may include one or more microprocessor, digital signal processor, microcontroller, and/or logic device capable of performing the same functions as these components. The controller 8711 or the memory 8713 may include at least one of the stack packages according to the embodiments of the present disclosure. The input/output unit 8712 may include at least one selected among a keypad, a keyboard, a display device, a touchscreen and so forth. The memory 8713 is a device for storing data. The memory 8713 may store data and/or commands to be executed by the controller 8711, and the like.

The memory 8713 may include a volatile memory device such as a DRAM and/or a nonvolatile memory device such as a flash memory. For example, a flash memory may be mounted to an information processing system such as a mobile terminal or a desktop computer. The flash memory may constitute a solid state disk (SSD). In this case, the electronic system 8710 may stably store a large amount of data in a flash memory system.

The electronic system 8710 may further include an interface 8714 configured to transmit and receive data to and from a communication network. The interface 8714 may be a wired or wireless type. For example, the interface 8714 may include an antenna or a wired or wireless transceiver.

The electronic system 8710 may be realized as a mobile system, a personal computer, an industrial computer or a logic system performing various functions. For example, the mobile system may be any one of a personal digital assistant (PDA), a portable computer, a tablet computer, a mobile phone, a smart phone, a wireless phone, a laptop computer, a memory card, a digital music system and an information transmission/reception system.

If the electronic system 8710 is an equipment capable of performing wireless communication, the electronic system 8710 may be used in a communication system using a technique of CDMA (code division multiple access), GSM (global system for mobile communications), NADC (north American digital cellular), E-TDMA (enhanced-time division multiple access), WCDMA (wideband code division multiple access), CDMA2000, LTE (long term evolution) or Wibro (wireless broadband Internet).

The concepts have been disclosed in conjunction with some embodiments as described above. Those skilled in the art will appreciate that various modifications, additions and substitutions are possible, without departing from the scope and spirit of the present disclosure. Accordingly, the embodiments disclosed in the present specification should be considered from not a restrictive standpoint but an illustrative standpoint. The scope of the concepts are not limited to the above descriptions but defined by the accompanying claims, and all of distinctive features in the equivalent scope should be construed as being included.

What is claimed is:

1. A stack package comprising:
a lower semiconductor chip disposed on a package substrate;
an interposer bridge disposed on the package substrate to be spaced apart from the lower semiconductor chip and including through vias; and an upper semiconductor chip disposed on the lower semiconductor chip to extend onto the interposer bridge and electrically connected to the package substrate by the through vias, wherein the upper semiconductor chip comprises:
- a first edge and a second edge which are opposite to each other;
- a first region located between the first and second edges;
- a second region located between the first region and the first edge;
- a third region located between the first region and the second edge;
- a first connection region overlapping with the through vias;
- a first power pad and a first signal pad disposed on the first region;
- a second power pad disposed on the second region;
- a third power pad disposed on the third region;
- a first redistributed layer pattern connected to the first signal pad to extend onto the first connection region; and
- a second redistributed layer pattern connecting the third, first, and second power pads to each other to extend onto the first connection region and including a first extension part that extends from the third region to reach the first region,
- wherein the first extension part has a width which is greater than a width of the first redistributed layer pattern.

2. The stack package of claim 1, wherein the second redistributed layer pattern further includes:
- a second extension part having a width which is greater than a width of the first redistributed layer pattern and extending from the first region onto the first connection region; and
- a third extension part having a width which is less than a width of the second extension part and connecting the first extension part to the second extension part.

3. The stack package of claim 1, wherein the second redistributed layer pattern is longer than the first redistributed layer pattern.

4. The stack package of claim 1, wherein the upper semiconductor chip further includes:
- a first ground pad disposed on the first region and located at a side of the first signal pad opposite to the first power pad;
- a second ground pad disposed on the second region;
- a third ground pad disposed on the third region; and
- a third redistributed layer pattern configured to connect the first, second and third ground pads to each other and to extend onto the first connection region, configured to include an extension part extending from the third region onto the first region and having a width which is greater than a width of the first redistributed layer pattern, and configured to be located at a side of the first redistributed layer pattern opposite to the second redistributed layer pattern.

5. The stack package of claim 1, wherein the second region of the upper semiconductor chip is disposed to be spaced apart from the first region such that a distance between the second region and the first edge is less than a distance between the second region and the first region.

6. The stack package of claim 1,
wherein the third region of the upper semiconductor chip is spaced apart from the first region such that a distance between the third region and the second edge is less than a distance between the third region and the first region; and wherein the third region of the upper semiconductor chip is located at a side of the first region opposite to the second region.

7. The stack package of claim 1, wherein the first region and the third region of the upper semiconductor chip overlap with the lower semiconductor chip.

8. The stack package of claim 1, wherein the first connection region of the upper semiconductor chip is spaced apart from the first region such that a distance between the first connection region and the first edge is less than a distance between the first connection region and the first region.

9. The stack package of claim 1, further comprising:
- first inner connectors disposed between the interposer bridge and the first connection region of the upper semiconductor chip to electrically connect the through vias to the first and second redistributed layer patterns extending onto the first connection region; and
- first supporting bumps disposed between the lower semiconductor chip and the upper semiconductor chip to support the upper semiconductor chip.

10. The stack package of claim 1, wherein the lower semiconductor chip includes:
- a third edge and a fourth edge which are opposite to each other;
- a fourth region located between the third and fourth edges;
- a fifth region located between the fourth region and the third edge;
- a sixth region located between the fourth region and the fourth edge;
- a second connection region disposed to be adjacent to the third edge such that a distance between the second connection region and the third edge is less than a distance between the second connection region and the fourth region;
- a fourth power pad and a second signal pad disposed on the fourth region;
- a fifth power pad disposed on the fifth region;
- a sixth power pad disposed on the sixth region;
- a fourth redistributed layer pattern connected to the second signal pad to extend onto the second connection region; and
- a fifth redistributed layer pattern connecting the sixth, fourth and fifth power pads to each other to extend onto the second connection region.

11. The stack package of claim 10,
wherein the fifth redistributed layer pattern includes a fourth extension part extending from the sixth region to reach the fourth region; and
wherein the fourth extension part has a width which is greater than a width of the fourth redistributed layer.

12. The stack package of claim 10, further comprising:
second inner connectors disposed between the package substrate and the second connection region of the lower semiconductor chip; and
second supporting bumps disposed between the package substrate and the lower semiconductor chip and located between the fourth edge of the lower semiconductor chip and the second inner connectors.

13. The stack package of claim 1, wherein the interposer bridge further includes a silicon substrate through which the through vias vertically pass.

14. A stack package comprising:
a lower semiconductor chip disposed on a package substrate;
an interposer bridge disposed on the package substrate to be spaced apart from the lower semiconductor chip and including through vias; and
an upper semiconductor chip disposed on the lower semiconductor chip to extend onto the interposer bridge and electrically connected to the package substrate by the through vias,
wherein the upper semiconductor chip comprises:
- a first edge and a second edge which are opposite to each other;
- a first region located between the first and second edges;
- a second region located between the first region and the first edge;
- a third region located between the first region and the second edge;
- a connection region overlapping with the through vias;
- a first redistributed layer pattern extending from the first region onto the connection region through the second region; and
- a second redistributed layer pattern configured to extend from the third region onto the connection region through the first and second regions and configured to have a length which is greater than a length of the first redistributed layer pattern,
- wherein at least one portion of the second redistributed layer pattern has a width which is greater than a width of the first redistributed layer pattern.

15. The stack package of claim 14,
wherein the upper semiconductor chip further includes chip pads disposed on the first, second and third regions; and
wherein the second redistributed layer pattern extends to connect the chip pads to each other.

16. The stack package of claim 14, wherein the second region of the upper semiconductor chip is disposed to be spaced apart from the first region such that a distance between the second region and the first edge is less than a distance between the second region and the first region.

17. The stack package of claim 14,
wherein the third region of the upper semiconductor chip is spaced apart from the first region such that a distance between the third region and the second edge is less than a distance between the third region and the first region; and
wherein the third region of the upper semiconductor chip is located at a side of the first region opposite to the second region.

18. The stack package of claim 14, wherein the connection region of the upper semiconductor chip is spaced apart from the first region such that a distance between the connection region and the first edge is less than a distance between the connection region and the first region.

19. The stack package of claim 14, further comprising:
first inner connectors disposed between the interposer bridge and the connection region of the upper semiconductor chip to electrically connect the through vias to the first and second redistributed layer patterns extending onto the connection region; and
supporting bumps disposed between the lower semiconductor chip and the upper semiconductor chip to support the upper semiconductor chip.

20. A stack package comprising:
a lower semiconductor chip disposed on a package substrate;
an interposer bridge disposed on the package substrate to be spaced apart from the lower semiconductor chip and including through vias; and
an upper semiconductor chip disposed on the lower semiconductor chip to extend onto the interposer bridge and electrically connected to the package substrate by the through vias,
wherein the upper semiconductor chip comprises:
- a first edge and a second edge which are opposite to each other;
- a first region located between the first and second edges;
- a third region located between the first region and the second edge;
- a first connection region overlapping with the through vias;
- a first redistributed layer pattern extending from the first region onto the connection region; and
- a second redistributed layer pattern configured to extend from the third region onto the connection region through the first region,
- wherein at least one portion of the second redistributed layer pattern has a width which is greater than a width of the first redistributed layer pattern.

* * * * *